(12) United States Patent
Larsson et al.

(10) Patent No.: US 11,240,929 B2
(45) Date of Patent: Feb. 1, 2022

(54) INHIBITOR MODULE AND SHIELDING ARRANGEMENTS FOR HIGH VOLTAGE EQUIPMENT

(71) Applicant: ABB Power Grids Switzerland AG, Baden (CH)

(72) Inventors: Mats Larsson, Västerås (SE); Christer Tornkvist, Strömsholm (SE); Liliana Arevalo, Ludvika (SE); Dong Wu, Ludvika (SE)

(73) Assignee: ABB Power Grids Switzerland AG, Baden (CH)

( * ) Notice: Subject to any disclaimer, the term of this patent is extended or adjusted under 35 U.S.C. 154(b) by 0 days.

(21) Appl. No.: 17/280,761

(22) PCT Filed: Sep. 27, 2018

(86) PCT No.: PCT/EP2018/076335
§ 371 (c)(1),
(2) Date: Mar. 26, 2021

(87) PCT Pub. No.: WO2020/064114
PCT Pub. Date: Apr. 2, 2020

(65) Prior Publication Data
US 2021/0315123 A1 Oct. 7, 2021

(51) Int. Cl.
*H02J 3/36* (2006.01)
*H05K 7/14* (2006.01)
(Continued)

(52) U.S. Cl.
CPC .......... *H05K 7/1432* (2013.01); *H01B 5/004* (2013.01); *H01B 17/42* (2013.01); *H02J 3/36* (2013.01)

(58) Field of Classification Search
CPC ...... H01B 5/004; H01B 17/42; H05K 7/1432; H02J 3/36
See application file for complete search history.

(56) References Cited

U.S. PATENT DOCUMENTS

2009/0266605 A1   10/2009  Ming et al.
2011/0025447 A1*   2/2011  Jacobson ............. H01F 37/005
                                                 336/840
(Continued)

FOREIGN PATENT DOCUMENTS

EP        2133970 A1    12/2009
WO     2009150100 A1    12/2009
(Continued)

OTHER PUBLICATIONS

Dong, Wu, et al., "The effects of a series connected resistor on the positive SI breakdown voltage of large air gaps", Cigre-Brasil, SCD1 Colloquium, Trends in Technology, Materials, Testing and Diagnostics Applied to Electric Power Systems, Rio de Janeiro, Brazil, Sep. 13-18, 2015, 6 pages.

*Primary Examiner* — Rafael O De Leon Domenech
(74) *Attorney, Agent, or Firm* — Slater Matsil, LLP

(57) ABSTRACT

The invention is concerned with an inhibitor module arrangement, a shielding arrangement comprising an inhibitor module and a converter station comprising a converter and a shielding arrangement. The inhibitor module arrangement comprises a first string, a second string, and at least one first inhibitor module (30), where the first string comprises resistors (R1), the second string comprises capacitors (C1, C2, C3), the first string is physically separated from and electrically connected in parallel with the second string and the at least one first inhibitor module (30) comprises a first electrical connection terminal (32) at a first end for connection to a piece of high voltage equipment, a second electric connection terminal (34) at a second end for connection to a first shield element for this piece and a closed interior comprising at least one of the strings electrically connected between the first and the second electrical connection terminals (32, 34).

19 Claims, 1 Drawing Sheet

(51) Int. Cl.
*H01B 5/00* (2006.01)
*H01B 17/42* (2006.01)

(56) References Cited

U.S. PATENT DOCUMENTS

2011/0310523 A1* 12/2011 Hedblad ............... H01L 23/473
                                                           361/212
2012/0099273 A1*  4/2012 Jacobson ............. H02M 7/003
                                                           361/689

FOREIGN PATENT DOCUMENTS

| WO | 2016066187 A1 | 5/2016 |
| WO | 2020064113 A1 | 4/2020 |

* cited by examiner

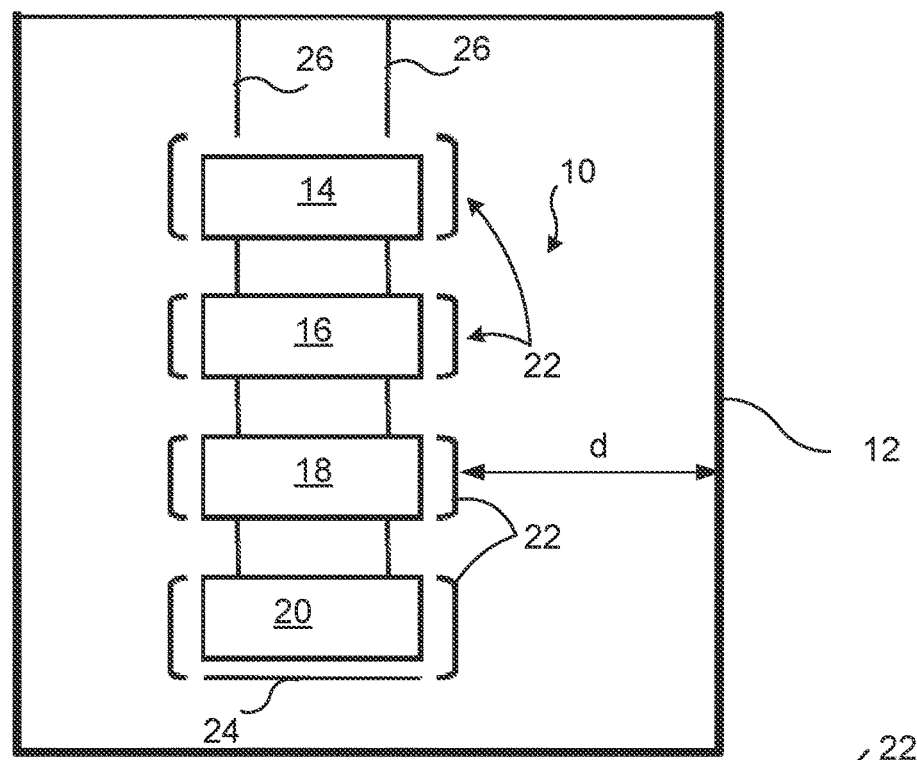
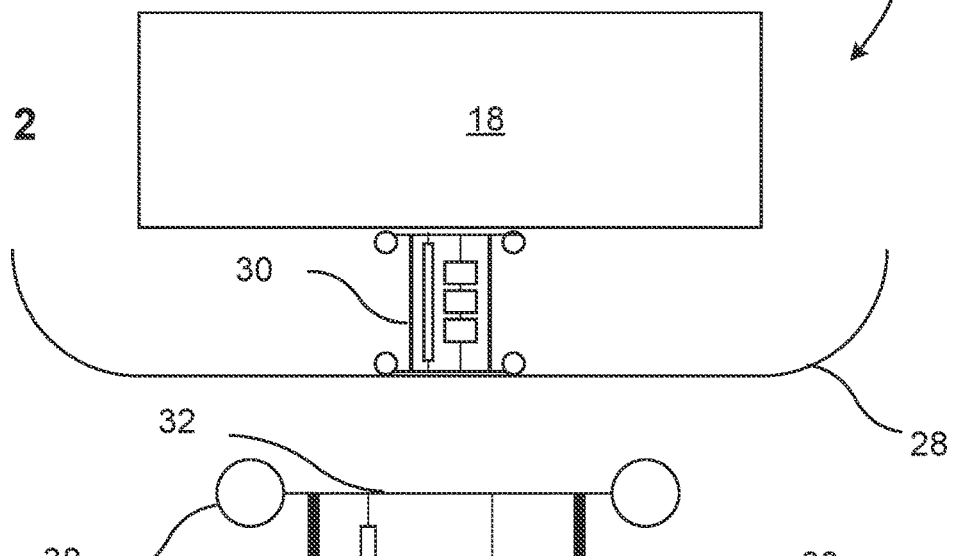
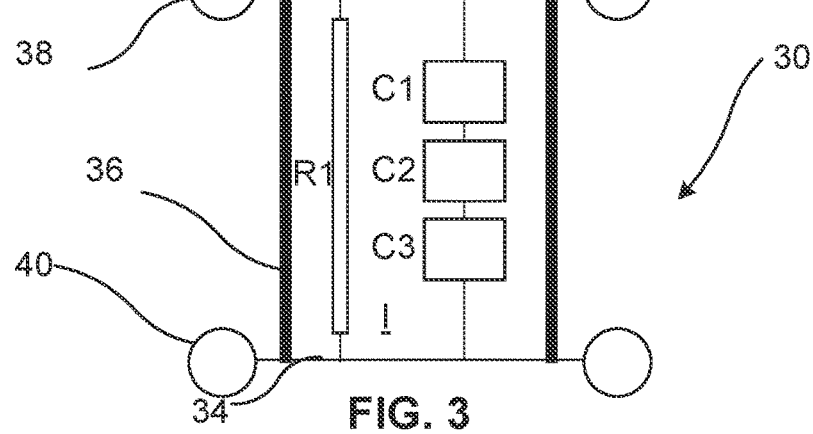

INHIBITOR MODULE AND SHIELDING ARRANGEMENTS FOR HIGH VOLTAGE EQUIPMENT

CROSS-REFERENCE TO RELATED APPLICATIONS

This application is a national stage application of International Application No. PCT/EP2018/076335, filed on Sep. 27, 2018, which application is hereby incorporated herein by reference.

FIELD OF INVENTION

The present invention relates to an inhibitor module arrangement, a shielding arrangement for a piece of high voltage equipment comprising an inhibitor module arrangement as well as to a converter station comprising a converter and such a shielding arrangement.

BACKGROUND

Electrical power transmission can be accomplished by high-voltage direct current (HVDC) and HVDC is in many cases a preferred option over Alternating Current (AC) transmission.

In electrical plants there may exist a need for performing a conversion from HVDC to three-phase AC, and vice versa. A HVDC power converter comprises a number of valves, which are key components of a converter station, and the valves are typically accommodated in a valve hall.

When designing a valve hall several considerations have to be taken into account. The security aspects are very important and require the valve hall to have some minimum space dimensions. For example, the air clearance between a power converter and the walls and ceiling of the valve hall within which it resides should in some cases be up to about ten meters and in others only a few meters. The dimensions of the valve hall are highly dependent on the voltage levels of the electrical power distribution network. The higher the voltage, the more distance to the surroundings is generally needed.

The dimensions of the valve hall are determined by the intended application, the design of the valve structure and the adjacent structures, among other factors.

However, in contrast to this, there is also a desire for the valve halls to be as small as possible. Land space is often scarce and expensive and there is therefore a desire to keep the size of the valve halls down. Further, different countries stipulate different regulations and in some countries building permits may be difficult to obtain. Further yet, also aesthetic aspects make it more desirable to provide small and compact substations, so that they affect the environment to as little extent as possible. The investment and installation costs, including for example material costs and labor costs, may in some countries be high and thus further yet adds to the desire to minimize the size of the valve hall.

The reliability, security and safety in a high voltage application such as a power converter is of great concern. Hazards in connection with power transformers comprise for example electric discharges; power failures due to high-intensity electric arcs may black out very large areas and are expensive for the power companies. Protection measures, either passive or active, are therefore crucially important. It is therefore of interest to obtain a technical solution where the normal air insulated valve can be compacted in smaller valve halls without trade-off of the reliability.

Some measures have been made in improving the high voltage assemblies for instance with a view to increasing security and enabling designing valve halls of smaller size, without lessening the reliability requirements.

Some of these measures may be based on the use of shielding arrangements. Shields or screens have the function of smoothening out the electrical field around the equipment. Thereby, shields reduce the risk of corona discharges as well as the risk of electrical breakdown of the equipment.

Instead of connecting the screen directly to the HV equipment, as commonly done, one initiative is described in US 2009/0266605, where a screen design is used having a resistor connected between a valve and a corresponding screen. The use of a resistor that is inhibiting electrical breakdown increases the withstand voltage of the valve.

However, there is a need for further improvement, especially with regard to improving the withstand voltage even further. It may for instance be of interest to simplify the optimization of the resistance and capacitance combined with the obtaining of a high reliability.

SUMMARY OF THE INVENTION

One object of the present invention is therefore to simplify the optimizing of the resistance and capacitance while at the same time achieving a high reliability.

This object is according to a first aspect achieved through an inhibitor module arrangement for connection between a piece of high voltage equipment and a first shield element for the piece of high voltage equipment, the inhibitor module arrangement comprising a first string,
a second string, and
at least one first inhibitor module,
wherein the first string comprises at least one resistor, the second string comprises at least one capacitor, the first string is physically separated from and electrically connected in parallel with the second string and the at least one first inhibitor module comprises
  a first electrical connection terminal at a first end of the module for connection to the piece of high voltage equipment, a second electric connection terminal at a second end of the module for connection to the first shield element, and
  a closed interior comprising at least one of the strings electrically connected between the first and the second electrical connection terminals.

The object is according to a second aspect also achieved through a shielding arrangement for a piece of high voltage equipment spaced from a neighboring object, where the piece of high voltage equipment has a first electric potential and the neighboring object has a second electric potential, the shielding arrangement comprising a first shield element for connection to the high voltage equipment and an inhibitor module arrangement according to the first aspect.

The object is according to a third aspect also achieved through a converter station comprising a converter for converting between alternating current and direct current and being enclosed in an enclosure. The converter comprises a number of converter valves, where at least one is provided with a shielding arrangement according to the second aspect.

The first potential may be an operating potential of the piece of high voltage equipment and the second potential may be ground potential.

Through the use of an inhibitor module arrangement comprising at least one first inhibitor module, resistor and capacitors may be better separated from each other and may additionally be better insulated from each other, which allows an improved optimization of the resistance and capacitance to be made combined with the obtaining of a high reliability.

The invention has a number of advantages. It achieves an increase in the withstand voltage of the piece of high voltage equipment without increasing the size of the used resistor and without compromising the reliability. Thereby the space surrounding the high voltage equipment may be more efficiently used. Thereby the distance between the piece of high voltage equipment and the neighbouring object may also be further reduced. The inhibitor module can also provide mechanical support for the first shield element.

BRIEF DESCRIPTION OF THE DRAWINGS

The present invention will in the following be described with reference being made to the accompanying drawings, where FIG. 1 schematically shows a grounded enclosure in the form of a valve hall comprising high voltage equipment in the form of a converter, FIG. 2 schematically shows a valve of the converter being shielded by a shielding arrangement according to a first embodiment comprising an inhibitor module arrangement including one inhibitor module, and FIG. 3 schematically shows the inhibitor module of the shielding arrangement in FIG. 2.

DETAILED DESCRIPTION OF THE INVENTION

The present invention concerns high voltage equipment in high power applications. The high voltage equipment may be a High Voltage Direct Current (HVDC) equipment operating at a high voltage such as at 320 kV and above. The equipment may furthermore be enclosed in an enclosure that has a different electric potential than the voltage at which the piece of equipment operates. It is for instance possible that the enclosure is grounded while the piece of equipment may operate at a voltage level of +1500 kV or −1500 kV or some high voltage therebetween. Other feasible voltage levels are ±800 kV. The equipment may for instance be a converter, converting between AC and DC such as a current source converter (CSC) or a voltage source converter (VSC). Moreover, a voltage source converter may be provided as a modular multilevel converter (MMC), where a number of cascaded converter submodules are used for forming an AC waveshape.

FIG. 1 schematically shows one such exemplifying HVDC converter 10 enclosed in an enclosure 12, which enclosure in this case is a building in the form of a valve hall comprising grounded walls, i.e. walls having an electric zero potential. The enclosure is one example of an object close to at least one piece of the high voltage equipment.

The converter 10 comprises a number of valves. In the example given in FIG. 1 the HVDC converter 10 is illustrated as comprising four valves 14, 16, 18 and 20. As an example, the valves may be installed hanging from the valve hall ceiling and fixed to the ceiling via suspending insulators 26. It should be realized that the way that the valves are being placed in the enclosure is not central and that they may as an exemplifying alternative be placed on a supporting structure on the valve floor.

There is also a shield structure comprising a plurality of shielding arrangements 22 for providing shielding against corona or streamer discharges. The shielding arrangements are provided for covering exposed surfaces of the valves in order to avoid possible corona or streamer discharges or electrical breakdown between the enclosure 12 and the valves 14, 16, 18 and 20. The exemplifying HVDC valves 14, 16, 18 and 20 shown in FIG. 1 comprise in total nine sides with exposed surfaces being protected by shielding arrangements 22, eight lateral sides facing each other at opposing surfaces and one lower side facing away from the ceiling. There is also a bottom shielding element 24 on the opposite of the valve stack in relation to the suspending insulators 26

Each such exposed surface is thus protected by a shielding arrangement against corona discharges and electrical breakdown from the valve to the enclosure, such as to a wall or to the floor. In the figure, also the distance d between one such shielding arrangement 22 and the wall 12 is indicated.

Each of the valves 14, 16, 18 and 20 may be made up of a number of series-connected switches, or as a number of cascaded submodules, where such a switch may be made up of a switching element like an Insulated Gate Bipolar Transistor (IGBT) or Integrated Gate-Commutated Thyristor (IGCT) with anti-parallel diode. A submodule may be realized as one or two strings of switches, where each string is connected in parallel with an energy storages element such as a capacitor or a battery. Alternatively, the valve may be a thyristor valve.

Moreover, the voltage at which a valve operates, for instance the DC level of the valve, may be considerable. Also, overvoltages due to lightning strikes and switching events in the system are critical for the insulation. At least one of the outermost valves 14 and 20 at each end of the structure may thus have a considerable voltage potential difference between itself and the enclosure.

The shielding arrangements 22 comprise shield elements in the form of screens at a distance from the valve element. A screen may also have a shape that stretches around any edges or corners of the physical valve shape.

Such screens may be necessary in order to protect a part of the converter 10, such as a valve, from any corona discharge and electrical breakdown from the HV part to the enclosure. As stated earlier, the voltages are high and therefore the distance d between the screen arrangement 22 and the enclosure 12 normally has to be high in order to safeguard that no corona or streamer discharges or electrical breakdown occurs.

One way of reducing the distance is through the shielding arrangement comprising a breakdown inhibiting resistance, for instance in the form of a breakdown inhibiting resistor. A breakdown inhibiting resistor acts as a current limitation device during a corona or streamer electrical discharge. As a result, the voltage withstand level of the valve arrangement is increased which in turn allows a more compact design. Through the use of such a resistor the surge impulse breakdown strength of the shielding arrangement may be increased. Further, increased DC withstand levels can also be accomplished. Improved safety in an HVDC valve hall can thereby be provided, without increasing the size of the valve hall within which the valves are accommodated.

In a realization of a design there are restrictions of how large the resistor can be made. If its resistance is too large a breakdown of the resistor may occur due to increased stress at corona or streamer discharges. It may therefore be of interest to further increase the withstand voltage of the valve without increasing the size as well as resistance of the resistor while at the same time retaining a high reliability.

Aspects of the present invention are directed towards raising the voltage withstand level together with providing a good reliability through a suitable isolation of components from each other as well as providing mechanical support for the used screens.

It is also of interest to combine a simplification of optimizing of the resistance and capacitance with a high reliability.

Aspects of the invention are directed to this problem.

A first embodiment of a shielding arrangement 22 that addresses the above-mentioned problems is shown in FIG. 2.

The shielding arrangement 22 comprises a first shield element or screen 28 adjacent and in electrical contact with the valve 18 via an inhibitor module arrangement comprising at least one first inhibitor module. In the example in FIG. 2, the inhibitor module arrangement only comprises a closed first inhibitor module 30. The closed first inhibitor module 30 is thus connected between the piece of high voltage equipment 18 and the first shield element 28.

As can be better seen in FIG. 3, the closed first inhibitor module 30 comprises a first string and a second string, where the first string comprises at least one resistor R1, the second string comprises at least one capacitor C1, C2, C3 and the first string is physically separated from and electrically connected in parallel with the second string. A resistor R1 may be a resistor in a string of series-connected resistor components comprising at least one component. In the exemplifying embodiment shown the first string comprises one resistor R1, while the second string comprises three series-connected capacitors C1, C2 and C3. The two parallel strings are electrically connected between the valve 18 and the screen 28 via a first and a second connection terminal 32 and 34.

The first inhibitor module 30 is thus closed. It may additionally be shaped as a cylinder. A first end of the module may therefore comprise the first electrically conducting connection terminal 32 for connection to the valve 18 and a second opposite end may comprise the second electrically conducting connection terminal 34 for connection to the screen 28. These connection terminals 32 and 34 may make up first and second opposite sides of the module 30. Between these two terminals 32 and 34 in a direction from the valve 18 to the screen 28 there is at least one wall 36, which wall 36 stretches between the first and second terminals 32 and 34. Thereby the interior of the module 30 comprising resistors and capacitors is sealed off or closed. There may more particularly be at least one sealed volume in the interior of the module 30 and this sealed volume is separated from the exterior of the module 30 by the wall 36. The wall 36 may be made of a non-conducting or dielectric material, such as reinforced glass fiber resin. As the wall may be shaped as a cylinder or tube, it can be seen that the first and second connection terminals 32 and 34 may be used for closing the open ends of this cylinder in order to form the sealed volume.

The two strings are thereby placed in a sealed volume or closed space in the interior of the module 32 and electrically connected to the two connection terminals 32 and 34, which sealed volume may be filled by an insulating or dielectric medium I. The medium may be solid, like a thermoplastic such as a dielectric polymer like polyurethane or an epoxy. As an alternative the insulating medium I may be fluid, such as a gas like SF6 or a liquid such as transformer oil. It is also possible with a mixture of solids and fluids such as a mixture of cellulose paper immersed in transformer oil.

When the insulating medium is a solid, at least one wall may be provided as an exterior surface of the solid insulation. The solid insulating medium I may be die cast directly using a dielectric polymer and formed around the resistors and capacitors. Thereby the sealed volume may be the volume in the solid insulation occupied by the resistors and capacitors.

In order to improve the shielding of the first inhibitor module 30, it may additionally be provided with two screens, a first screen 38 placed at and connected to the first connection terminal 34 and a second screen 40 placed at and connected to the second connection terminal 34. The first screen 28 may more particularly surround the wall 36 at the first end, which is thus also at the first connection terminal 32, and the second screen 40 may surround the wall 38 at the second end, which is thus at the second connection terminal 34. Both these screens 38 and 40 may be made of electrically conducting material. They may furthermore with advantage have a toroidal shape. Thereby shielding at the edges between the connection terminals 32 and 34 and the wall 36 of the module 30 is obtained. The at least one wall 36 of the module may additionally provide mechanical support for the terminal screens 38 and 40.

The first string comprising resistor R1 may be set to have a resistance in the range 0.1-12 MΩ, with advantage in the range 0.2-4 MΩ, and preferably in the range 0.5-3 MΩ. The second string comprising capacitors C1, C2 and C3 may in turn have a capacitance in the range 0.1-10 nF, which is a value where stray capacitance between the screen 28 and the enclosure wall is not dominant.

Furthermore, the capacitance and the resistance may form a time constant t corresponding to how fast the capacitors C1 C2 and C3 of the second string are discharged. The time constant t may be in a range of 10 μs-50 ms, with advantage 0.1-15 ms and preferably 0.5-5 ms. The time constant t corresponds to or is proportional to RC, where R is the resistance of the first string and C is the capacitance of the second string.

Through putting a first string of resistors and a second string of capacitors between the high voltage equipment, here exemplified by the valve 18, and its high voltage shields, here exemplified by the shield 28, it is possible to improve the withstand voltage of that equipment. The module 30 acts as a current limiter for charges from a corona or streamer discharge. As a result, the withstand voltage level between the valve 18 and shield 28 is increased by the module 30.

The functionality of the components in the module is briefly the following:

Under normal conditions and without any electrical discharge, the screen 28 takes the same potential as the HV part, i.e. as the valve 18 to which the screen 28 is connected via the module 30. The screen 28 will therefore act as any ordinary HV screen. In normal service, the resistor R1 and capacitors C1, C2 and C3 are not stressed by either current or electric field and should not significantly influence the function of the high voltage equipment, due to the selected values of capacitance and resistor.

The resistor R1 in the first string thus conducts sufficiently well to make sure that the screen 28 and the valve 18 are at the same potential during normal operation. The potential of the screen follows the HV equipment when any overvoltage occurs in the system, if there are no discharge events in the air close to the screen.

However, as soon as a corona or streamer discharge occurs at the outer HV screen 28, the current drawn by the discharge is limited by the resistor R1 which frustrates the discharge.

When any discharges occur at the high voltage screen, the second string of capacitors will consume charges and reduce available charges supplied into the corona or streamer discharge. Due to shunting charges to the second string of capacitors, the supply of charges to the corona or streamer discharge growth will be restricted and inhibiting the discharge to further develop. As it turns out, a higher voltage will be needed in order to induce a spark over from the screen to ground, which is equivalent to increasing the withstand voltage defined by the first string of resistors.

An optimization that increases the withstand voltage is thus obtained through using resistor and capacitor values selected such that the supply of electric charges to a corona or streamer discharge is restricted by the first and second strings.

The combination of resistors and capacitors of suitable chosen values thus achieves a higher withstand voltage than only using a first string of resistors, which is done without increasing the size of the resistors in the first string.

However, unless proper measures are taken, there is a risk that the reliability is impeded by the combination of the first and second strings.

Moreover, measures can also be performed for simplifying such optimization.

The invention is therefore directed towards simplifying the optimization of components combined with obtaining a proper and reliable performance.

When the earlier described resistor and capacitor are in operation, i.e. inhibiting a breakdown during an overvoltage surge, both strings of components experience a high voltage stress. The components of both strings need accordingly to be properly screened from each other and local external fields in order to be able to withstand the high voltage as well as to mediate a controlled breakdown in the protection gap between the screen 28 and the valve 18.

Furthermore, the components put a dielectric demand on the mechanical support of the screen.

The problems described above can be solved by the use of the inhibitor module arrangement comprising the at least one first inhibitor module 30. The first inhibitor module 30 may therefore be designed to handle all the requirements of electrical, insulation and mechanical nature.

The combination of resistors and capacitors with the values given above may match a specified withstand voltage level that is higher than the withstand level defined by the resistors alone. Through putting the first string of resistors R1 together with a second string of capacitors C1, C2 and C3 in the interior of the module 30 a sufficiently mechanical robust structure is obtained that eliminates the need of any other mechanical support from the main shield 28 of the HV equipment 18. Through the provision of the closed module with the components physically separated from each other a good withstand voltage of and between the components is obtained, which results in a good reliability with a low risk for internal breakdown during operation. By filling the volume around the components with an insulating or dielectric medium, the withstand voltage of, and between, the components are further improved. This reduces the risk for internal breakdown during operation even further thereby increasing the reliability. The resistivity can be achieved either by a commercial component. However, when a die cast solid insulating medium is used, the at least one resistor may be obtained through filling material of suitable resistivity in the die cast structure of the dielectric material.

The placing of a string in an inhibitor module, perhaps surrounded by an insulating medium also allows the first and second strings to be independently optimized, which simplifies the optimization process of obtaining a raised withstand voltage.

The terminal screens 38 and 40 are not only provided for smoothing out and controlling the electric field outside the module 30. They may also serve as a part that initiates a corona or streamer discharge at an overvoltage of the module.

The shape and distance between the screens 38 and 40 of the inhibitor module 30 may ensure that there is enough electrical withstand capability. They may thus be designed for a certain first external withstand voltage, while the components in the interior are designed for a second internal withstand voltage.

The external screens 38 and 40 surrounding the wall 36 of the module can thus be designed in such a way that the needed external withstand voltage of the module is achieved. The external withstand voltage may for this reason be set higher than the withstand voltage of the first string alone. However, it may at the same time be set lower than the second internal withstand voltage obtained through the selected resistor and capacitor values. Thereby any breakdown over the module 30 will occur between the screens 38 and 40 and not damage the interior of the module 30. The design should be accomplished so that the distance and geometry between the first and second screen of a gap, i.e. a protective gap defined by the distance between the two screens 38 and 40 along the length of the wall 36, is closed when the voltage above the module is larger than the external withstand voltage. This geometry and length of the gap should thus be designed so that when a corona or streamer discharge is initiated, a sparkover will occur.

The inhibitor module 30 is compact and can be fitted into an existing space between the piece of high voltage equipment and a screen in many already existing designs. The inhibitor module 30 may thus be retrofit into an already existing high voltage design.

The invention has a number of further advantages. It allows the footprint and cost of high voltage equipment such as HVDC installations to be reduced. By reducing the needed air clearance for insulation, significantly advances can be made in this field.

The neighboring object was above exemplified by an enclosure in the form of a valve hall. It should be realized that the neighboring object is in no way limited to such an object. In fact, the neighboring object does not have to be an enclosure but can be a separate object close to a part of the high voltage equipment. Such a neighboring object may as an example be provided outdoors.

From the foregoing discussion it is evident that the present invention can be varied in a multitude of ways.

It is for instance possible that there are more inhibitor modules in the inhibitor module arrangement. There may for instance be a second inhibitor module connected in parallel with the first inhibitor module between the valve 18 and screen 28. In this case the first inhibitor module may comprise the first string of resistors, while the second inhibitor module may comprise the second string of capacitors or vice versa. One advantage of this is an even better mechanical stability.

It shall consequently be realized that the present invention is only to be limited by the following claims.

The invention claimed is:

1. An inhibitor module arrangement for connection between a piece of high voltage equipment and a first shield element for the piece of high voltage equipment, the inhibitor module arrangement comprising:

a first string that comprises at least one resistor;

a second string that comprises at least one capacitor, the first string being physically separated from and electrically connected in parallel with the second string; and at least one first inhibitor module comprising:
a first electrical connection terminal at a first end of the module for connection to the piece of high voltage equipment;
a second electric connection terminal at a second end of the module for connection to the first shield element; and
a closed interior comprising at least one of the first and second strings electrically connected between the first and the second electrical connection terminals.

2. The inhibitor module arrangement according to claim 1, wherein the first inhibitor module comprises both the first string and the second string connected between the first and the second electrical connection terminals.

3. The inhibitor module arrangement according to claim 1, further comprising a second inhibitor module, wherein the first inhibitor module comprises the first string and the second inhibitor module comprises the second string.

4. The inhibitor module arrangement according claim 1, wherein the closed interior comprises an insulating medium.

5. The inhibitor module arrangement according to claim 4, wherein the insulating medium is fluid.

6. The inhibitor module arrangement according to claim 4, wherein the insulating medium is solid.

7. The inhibitor module arrangement according to claim 6, wherein the at least one resistor is realized as a resistive filling material in a die cast structure of solid insulating medium.

8. The inhibitor module arrangement according to claim 1, further comprising at least one wall of dielectric material stretching between the first and second electrical connection terminals of the first inhibitor module in order to separate the interior of the at least one inhibitor module from an exterior of the inhibitor module.

9. The inhibitor module arrangement according to claim 8, further comprising a first screen surrounding the at least one wall at the first end of the first inhibitor module and connected to the first electrical connection terminal and a second screen surrounding the at least one wall at the second end of the first inhibitor module and connected to the second electrical connection terminal.

10. The inhibitor module arrangement according to claim 9, wherein the exterior of the first inhibitor module has a first withstand voltage between the first and second connection terminals and the interior of the first inhibitor module has a second withstand voltage between the first and second connection terminals, where the first withstand voltage is lower than the second withstand voltage.

11. The inhibitor module arrangement according to claim 9, wherein the first and second screens each have a toroidal shape.

12. The inhibitor module arrangement according to claim 1, wherein a resistance of the first string and a capacitance of the second string together define a time constant in a range of 10 µs-50 ms.

13. The inhibitor module arrangement according to claim 1, wherein a resistance of the first string is in the range 0.1-12 MΩ and the capacitance of the second string is in the range 0.1-10 nF.

14. A shielding arrangement for a piece of high voltage equipment spaced from a neighboring object, where the piece of high voltage equipment has a first electric potential and the neighboring object has a second electric potential, the shielding arrangement comprising a first shield element for connection connected to the high voltage equipment and an inhibitor module arrangement comprising:
a first string that comprises at least one resistor;
a second string that comprises at least one capacitor, the first string being physically separated from and electrically connected in parallel with the second string; and
at least one first inhibitor module comprising:
a first electrical connection terminal at a first end of the module connected to the piece of high voltage equipment;
a second electric connection terminal at a second end of the module connected to the first shield element; and
a closed interior comprising at least one of the first and second strings electrically connected between the first and the second electrical connection terminals.

15. A converter station comprising:
a converter for converting between alternating current and direct current, the converter comprising a plurality of converter valves;
an enclosure, the converter being enclosed in an enclosure wherein at least one of the converter valves is provided with a shielding arrangement;
wherein the at least one converter valve has a first electric potential and the enclosure has a second electric potential;
wherein the shielding arrangement comprises a first shield element connected to the at least one converter valve and an inhibitor module arrangement; and
wherein the inhibitor module arrangement comprises:
a first string that comprises at least one resistor;
a second string that comprises at least one capacitor, the first string being physically separated from and electrically connected in parallel with the second string; and
at least one first inhibitor module comprising:
a first electrical connection terminal at a first end of the module connected to the at least one converter valve;
a second electric connection terminal at a second end of the module connected to the first shield element; and
a closed interior comprising at least one of the first and second strings electrically connected between the first and the second electrical connection terminals.

16. The inhibitor module arrangement according to claim 12, wherein a resistance of the first string and a capacitance of the second string together define a time constant in a range of 0.1-15 ms.

17. The inhibitor module arrangement according to claim 12, wherein a resistance of the first string and a capacitance of the second string together define a time constant in a range of 0.5-5 ms.

18. The inhibitor module arrangement according to claim 13, wherein a resistance of the first string is in the range of 0.2-4 MΩ.

19. The inhibitor module arrangement according to claim 13, wherein a resistance of the first string is in the range of 0.5-3 MΩ.

* * * * *